(12) United States Patent
Simola et al.

(10) Patent No.: US 8,253,036 B2
(45) Date of Patent: Aug. 28, 2012

(54) JOINT STRUCTURE BETWEEN THE WALL ELEMENTS OF A MAGNETICALLY SHIELDED ROOM

(75) Inventors: Juha Simola, Helsinki (FI); Petteri Laine, Helsinki (FI); Heikki Rakkolainen, Kauttua (FI)

(73) Assignee: Elekta AB (Publ) (FI)

( * ) Notice: Subject to any disclaimer, the term of this patent is extended or adjusted under 35 U.S.C. 154(b) by 867 days.

(21) Appl. No.: 11/659,808

(22) PCT Filed: Sep. 8, 2005

(86) PCT No.: PCT/FI2005/000385
§ 371 (c)(1),
(2), (4) Date: Sep. 4, 2007

(87) PCT Pub. No.: WO2006/027416
PCT Pub. Date: Mar. 16, 2006

(65) Prior Publication Data
US 2008/0050172 A1    Feb. 28, 2008

(30) Foreign Application Priority Data

Sep. 10, 2004   (FI) .................................... 20041179

(51) Int. Cl.
*H05K 9/00* (2006.01)
(52) U.S. Cl. .......... 174/353; 174/362; 174/363; 174/373
(58) Field of Classification Search .................. 174/353, 174/359, 362, 363, 366, 371, 372, 373, 375, 174/384, 391; 52/173.1, 483.1
See application file for complete search history.

(56) References Cited

U.S. PATENT DOCUMENTS

| | | | | |
|---|---|---|---|---|
| 3,147,336 A | * | 9/1964 | Mathews | 174/371 |
| 4,732,454 A | * | 3/1988 | Saito et al. | 359/585 |

(Continued)

FOREIGN PATENT DOCUMENTS

DE   43 00 564 A1   8/1993

(Continued)

OTHER PUBLICATIONS

The Extended European Search Report dated Oct. 28, 2010; Application No./Patent No. 05786155.1-2214/1803341 PCT/FI2005000385.

*Primary Examiner* — Victor MacArthur
(74) *Attorney, Agent, or Firm* — Studebaker & Brackett PC; Donald R. Studebaker

(57) ABSTRACT

The present invention discloses a joint structure between the wall elements of a light-weight magnetically shielded room. In the joint structure, the end of the aluminum plate of the element is stepped and its surface roughened. In addition to this, the aluminum plate is coated, for example, with tin to improve the electrical contact. The joint includes μ metal plates which are used to make a magnetic contact between the μ metal plates of the elements. The compression force achieved by means of bolts is transmitted to the joint by means of an aluminum moulding. The non-continuous compression force is balanced over the entire joint area by using presser rubbers. The joint structure is protected by means of supporting profiles which are used to electrically couple the thinner aluminum plate of the sandwich type wall element to the thinner aluminum plate of an adjacent element. The thinner aluminum plate and the supporting profile can also be coated, for example, with tin to improve the contact.

8 Claims, 1 Drawing Sheet

U.S. PATENT DOCUMENTS

| | | | |
|---|---|---|---|
| 4,755,630 A | 7/1988 | Smith et al. | |
| 4,959,504 A | 9/1990 | Yarger et al. | |
| 5,043,529 A | 8/1991 | Vanesky et al. | |
| 5,170,009 A * | 12/1992 | Kadokura | 174/363 |
| 5,210,373 A | 5/1993 | Weber | |
| 5,335,464 A * | 8/1994 | Vanesky et al. | 174/374 |
| 5,981,871 A * | 11/1999 | Trumble et al. | 174/363 |
| 6,282,848 B1 | 9/2001 | Schlapfer | |
| 7,335,838 B2 * | 2/2008 | Simola | 174/386 |

FOREIGN PATENT DOCUMENTS

| | | |
|---|---|---|
| EP | 0359864 A1 | 3/1990 |
| GB | 2017197 A | 10/1979 |
| JP | 04-083396 | 3/1992 |
| JP | 05-009988 | 1/1993 |
| JP | 08-319683 | 12/1996 |
| JP | 10-256771 | 9/1998 |
| WO | 03/059030 A1 | 7/2003 |

* cited by examiner

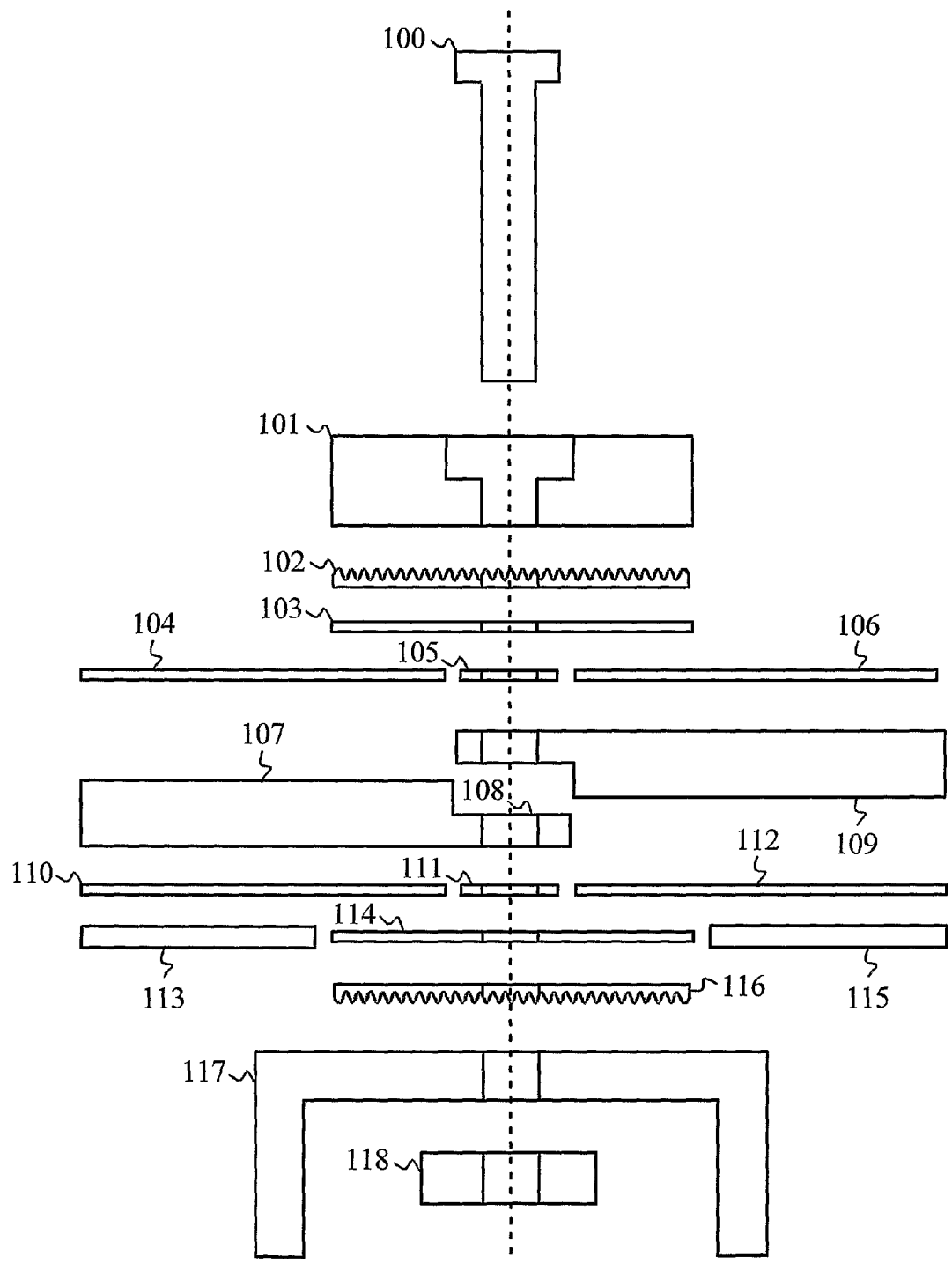

JOINT STRUCTURE BETWEEN THE WALL ELEMENTS OF A MAGNETICALLY SHIELDED ROOM

FIELD OF THE INVENTION

The invention relates to magnetic shielding of measuring devices against interferences produced by the environment.

BACKGROUND OF THE INVENTION

In several applications of measurement technology, the signals to be measured are very weak in size. For example, biomagnetic signals are among signals of this type. Weak signals are very susceptible to electromagnetic interferences produced by the environment for the interference signals to be perceived in the environment can be up to million times bigger compared to the biomagnetic signal being measured. Therefore, the sensors or other measuring devices that measure weak signals must be shielded very well against external interferences, or the effect of the interferences must be minimised in the region to be measured in some other manner.

One way of shielding sensitive measuring devices against electromagnetic interferences is to place near the measuring sensors sources which produce an electric and magnetic field and compensate the interferences. This enables one to produce in the region of the measuring sensors a resultant field enabling one to perceive a weak useful signal to be measured as the interference field and the compensating field cancel each other as well as possible.

Another way of protecting oneself from interferences is to place the measuring devices within a magnetically shielded room. The shielded room is made of a material that effectively suppresses the magnetic field caused by an external interference. The shielded room can be fixedly built in a desired place, or can be a so-called light-weight shielded room, which is built by assembling a shielding structure from separate elements about the measuring devices. Besides the materials of the elements, the joints between the wall elements are of importance from the standpoint of the propagating of the magnetic field, so specific attention must be paid to the structure of the joints.

Publication WO 03059030 discloses a structure of a wall element designed for a magnetically shielded room. The wall element has a so-called sandwich structure having an electrically conducting metal plate in the middle. The metal can consist e.g. of aluminum. The middlemost plate has on both sides thereof plates that are made of a different material than the middlemost plate, but are similar to one another. The edging plates have a high magnetic permeability and are typically made of µ metal. Furthermore, the structure comprises another thinner aluminum plate so that the order of the plates as viewed from the cross section of the element is as follows: a thinner aluminum plate, a µ metal plate, a thicker aluminum plate, a µ metal plate. Placed between the thicker aluminum plate and the µ metal plate is a thin layer of dielectric material. The plates are tightly attached to one another without air gaps. This structure yields a good magnetic protection against interferences.

Further, publication WO 03059030 describes a joint structure between two wall elements of a shielded room. The wall elements are placed a little apart from each other, and two strips are placed in the junction one on both sides of the joint. One strip consists of a thin layer of resilient material, of a layer of ferromagnetic material (such as µ metal) and of an aluminum layer. The ferromagnetic layer joins the µ metal parts of the elements to form a magnetic contact and the aluminum layer electrically joins the thick aluminum layers of the elements. The U beams that are compressed on top of the strips are, in addition, used to protect the joint, and also function as a supporting frame of the structure.

A magnetically shielded room can also be built in a more simple manner, that is, for example, from one aluminum plate or from two superimposed aluminum plates. As the material one can also use a mixture of iron and nickel (Fe—Ni) having a high permeability.

Two wall elements having a sandwich structure can be attached to one another by simply placing them on top of each other at one ends thereof over a short stretch and by pressing the joint tight e.g. with a bolt. The joint structure of this kind has the weakness that the joint is rough (having a "step" the size of the thickness of the wall) and susceptible to interference. The electrical conductivity between the aluminum parts of adjacent elements is not the best possible one due to the simple structure of the fastening.

One prior-art solution for improving the electrical conductivity of a junction between aluminum plates is to use separate strips. The strips form a contact between the aluminum plates so that the electrical conductivity in the junction is improved.

Publication U.S. Pat. No. 6,734,353 discloses a solution for compensating interferences in a magnetically shielded room. An interfering magnetic field is measured with coils placed in three different directions (directions of the X, y and z axis) that have each been wound about their own wall element. Based on the measurement results, a compensating magnetic field is generated in the measurement region.

The problem with the prior-art technique for all the solutions mentioned above is the weak contact of the aluminum plates. This results in a relatively strong coupling of the interference signals through the joints of the shielded room into the measurement room.

OBJECTIVE OF THE INVENTION

The objective of the invention is to disclose a new type of a joint structure between the wall elements of a light-weight shielded room to achieve a good magnetic shielding. One specific objective of the invention is to alleviate the problems referred to above.

SUMMARY OF THE INVENTION

The present invention discloses a new type of a joint structure between two adjacent wall elements of a magnetically shielded room. In a preferred embodiment of the invention, the wall element is built so that it has a ferromagnetic µ metal plate, a thicker aluminum plate, another ferromagnetic µ metal plate and a thinner aluminum plate one upon the other, in this order, as viewed from the edge of the inside of the shielded room to be built to the outer edge. The thicker aluminum plate is machined so that two elements can be joined together with a stepped tongue-and-groove joint. The machining is performed so that a narrow spike is projecting from the edge of the element, whereby the spike has e.g. half the thickness of the thick aluminum plate.

In addition, a thin aluminum moulding on both sides of the thick aluminum plate is needed for the joint. On top of this there is provided a ferromagnetic µ metal moulding, which joins the µ metal plates of two adjacent elements together. Two pieces of mouldings are needed for one joint, one on top of each aluminum moulding.

The physical dimensions of the plates have given tolerances, resulting in practice in that the plates and the profiles are not of completely uniform thickness. As two elements of non-uniform thickness are pressed against one another, they cause compression in the joint between them that is rather dot-like than continuous. This harmful phenomenon is eliminated when using presser rubbers to balance the pressing force over the entire joint area. In a preferred embodiment of the present invention, the presser rubber has a lightened cross section on the one side or both sides so that the spring constant associated with the compression of the presser rubber is smaller than that of the equal-thick rubber moulding. The lightening of the presser rubber can be implemented by shaping the profile to be wavy on either sides or both sides. In the present invention, the profiled presser rubber is placed on top of each µ metal moulding.

In the present invention, the electrical contact between the thinner aluminum plates is made over the joint by using supporting profiles, which are made, for example, from aluminum. Further, the supporting profile makes the joint more robust, providing the joint with a practical edge through which to fasten a bolt. A bolt and a threaded moulding can act to achieve the necessary compression in the joint. Instead of a threaded moulding, it is also possible to use a nut and a base plate.

The notch in the aluminum plates is made to be such that the plates can be directly coupled together, resulting in a planar, stepless junction. In the present invention, the contact areas of the notch with the notch in the aluminum plate of the other element are made roughened. Further, the aluminum plate is coated electrolytically, for example, with tin, improving the electrical contact and eliminating the weakening effect on the functioning of the shielded room that is caused by the oxide layer possibly during use. The thinner aluminum layer and aluminum supporting profiles can also be coated with a suitable coating material, e.g. with tin to improve the contact.

The present invention has the advantage of improved magnetic shielding compared to the prior art. The conductivity (electrical contact) between the adjacent elements of the joint is an essential factor from the standpoint of the magnetic interferences that are coupled through the wall. If we compare a regular, non-coated and smooth aluminum plate, which is fastened with a bolt, to another similar aluminum plate, then we obtain a conductivity of about a hundredth part compared to a situation in which an aluminum plate that has been notched, roughened and coated with tin has been coupled to another similar plate, as shown in the present invention.

A further advantage is that the structure of the joint does not get too complicated as the conductivity gets better when comparing the invention to the prior art. The joint according to the invention has a relatively simple structure.

LIST OF FIGURES

The FIGURE shows one example of a joint structure between the wall elements according to the invention.

DETAILED DESCRIPTION OF THE INVENTION

The present invention discloses a joint 35 structure between the wall elements of a magnetically shielded room. The cross section of the joint structure is shown in the FIGURE.

The joint structure is associated specifically with the structure of a so-called lightweight shielded room. A lightweight shielded room is a shielded room shielding against magnetic interferences and consisting of elements that can be built on site about the measuring devices. The joint structure is used to join together two so-called sandwich elements. One wall element consists of a thick aluminum plate 107, coated e.g. with tin, of an inner µ metal plate 104, of an outer µ metal plate 110 and of a thin aluminum plate 113. An inner plate is herein used to mean a plate that is disposed closer to the measuring equipment to be shielded with the elements and at the same time closer to the inside of the shielded room. When examining the plate structure from the inside of the shielded room to the outside, the components of the plate are in the following order in a preferred embodiment: an inner µ metal plate 104, an inner aluminum plate 107, an outer µ metal plate 110 and an outer aluminum plate 113. The aforementioned plates can be attached to one another by gluing them on top of each other, thus enabling one to form one wall element of a shielded room.

Similarly, the second wall element needed in the formation of the joint structure contains the same components as the first element described above. The components that can be seen in the cross section include an inner µ metal plate 106, an inner aluminum plate 109, an outer µ metal plate 112 and an outer aluminum plate 115.

In the joint structure of the present invention, the inner aluminum plate 107 has been provided with a stepped junction 108. The step can be made so that in the first wall element, a notch 108 is milled in the inner surface of the inner aluminum plate 107, which is in the surface situated on the side of the bolt base. Similarly, the inner aluminum plate 109 of the second wall element is stepped by milling a notch on the outer surface of the plate. As shown in the FIGURE, the stepping is made to form an L shape so that adjacent elements match, forming a stepless planar surface. In a preferred embodiment, the surface of the step junction 108 is machined, in addition, to be rough, due to which the electrical contact between the plates 107, 109 can be made better compared with the electrical contact between smooth aluminum surfaces.

In a preferred embodiment, a thin tin layer is formed on the surface of the inner aluminum plate 107, 109, e.g. electrically. In case there is a layer of aluminum oxide deposited on the surface of the aluminum plate 107, 109, it is worth etching off prior to the electrolysis. In this manner, no extra detrimental junctions are formed in the structure. In a preferred embodiment, the inner aluminum plate 107 has a thickness of the order of ten millimeters.

The joint is pressed together by means of a bolt 100 and a threaded moulding 118. One alternative for a moulding is to use a nut and base plates. Bolts are fastened to the joint so densely that a compression of sufficient size and uniformity is achieved in the joint. The compression force can be distributed more evenly over the entire junction area by using supporting profiles 101, 117. In addition to these, the compression of the joint can be further balanced by means of presser rubbers 102, 116. A presser rubber 116 is dimensioned so that when the bolts 100 are tightened to a tightness defined by use, the profile 117 forms an electrical contact between the outer aluminum plates 113, 115 of adjacent elements. At the same time, the compressed presser rubber 116 forces the µ metal strip 114 tightly against the outer µ metal plates 110, 112. A perforated aluminum moulding 111 is needed to transmit the compression force of the bolts to the junction of the aluminum plates 107, 109. Being a material that more evenly distributes the compression force, a rubber of suitable quality is ideal in that respect that it has a minimally small residual compression compared to the other resilient materials. As rubber, however, requires a rather high compression pressure to be compressed, it is preferred to profile the rubber mouldings 102, 116 so that the pressure caused by the bolts to be used in the joint is sufficient enough to yield a compression of the order of about one millimeter. This enables one to achieve in the joint mouldings 103, 114 the desired deformation that forgives the thickness tolerances of the metal plates. In the same manner, the supporting beam 117 is used to achieve a proper electrical contact to the outer aluminum plates 113, 115.

Similarly, in that part of the joint that is situated on the side of the base of the bolt 100, a presser rubber 102, a µ metal strip 103 and a perforated aluminum moulding 105 are used. In conjunction with the fastening, the base of the bolt sinks inside the profile 101. The functional principle for balancing the compression force is the same also in that part of the joint structure that is situated on the side of the bolt base.

A good electrical conductivity between the aluminum parts of adjacent elements is required of a joint structure that effectively shields against magnetic interferences. In addition, a good magnetic conductivity (small reluctance) between the µ metal parts of adjacent elements is required.

A good electrical conductivity is achieved by means of a sufficiently powerful compression force that is applied to the joint, by means of the roughness of the contact surfaces to be pressed together and by means of the tin coating of the aluminum plate. A small reluctance between the µ metal plates is achieved by forcing, on top of the µ metal plates 110, 112 of adjacent elements, a µ metal moulding 114 of sufficient width that joins the plates together. Similarly, on the other side of the joint structure, the µ metal plates 104, 106 are joined together by means of a µ metal moulding 103. From the reluctance viewpoint, it is substantial that the gap between the µ metal plate and moulding is as small as possible throughout the structure. This is achieved by balancing the compression force of the bolts over the entire area of the joint by means of presser rubbers 102, 116. In one example of the invention, the presser rubbers 102, 116 can be fastened prior to joining the elements by gluing them to the µ metal mouldings or by using a two-sided tape.

Coating the aluminum plates with tin (or with some other metal) enables one to avoid the effect of the oxide layer that is deposited on the surface of aluminum as a factor weakening the electrical contact. Once a tin layer having a thickness of the order of micrometers has been deposited on top of the plate by means of electrolysis, there will be no oxide layer. The coating with tin can be made for the aluminum plates 107, 109, for the thinner aluminum plates 113, 115 and also for the supporting profile 117 to improve the electrical contact. It is also possible that just a part of the aforementioned plate surfaces are coated, for example, due to reasons related to manufacturing technique, or to maximise the cost efficiency.

In a preferred embodiment of the present invention, the profile 101 has a thickness of about 15 mm; the µ metal plate 104, 106, 110, 112 and moulding 103, 114 have a thickness of about 1 mm; the inner aluminum plate 107, 109 has a thickness of about 10 mm; the notch 108 has a height of about the half of the thickness of the plate 107, 109; the outer aluminum plate 113, 115 has a thickness of about 2 mm; and the supporting profile 117 has a thickness of about 7 mm.

The invention is not limited merely to the examples of its embodiments referred to above; instead many variations are possible within the scope of the inventive idea defined by the claims.

The invention claimed is:

1. A joint structure operatively connected between a first wall element and a second wall element of a magnetically shielded room, wherein both wall elements operatively connected in order from inside of the shielded room to the outside of the shielded room, comprising:
    a first µ metal plate;
    a first aluminum plate;
    a second µ metal plate;
    a second aluminum plate;
    wherein the joint structure further comprises, operatively connected in order from inside of the shielded room to the outside of the shielded room:
    a bolt;
    a first supporting profile;
    a first presser rubber for balancing a compression force in the joint over an entire joint area;
    a first µ metal molding for making a magnetic contact between the first µ metal plates;
    a first perforated aluminum molding;
    the wall elements, wherein there is a first notch on an edge of the first aluminum plate of the first wall element, and a second notch on an edge of the first aluminum plate of the second wall element, a roughened surface and a first coating on a contact surface of the first aluminum plates, so that the first aluminum plates of the elements match, thereby forming a tongue-and-groove joint, the first aluminum plates being disposed on a same plane;
    a second perforated aluminum molding;
    a second µ metal molding for making a magnetic contact between the second µ metal plates;
    a second presser rubber for balancing the compression force in the joint over the entire joint area;
    a second supporting profile for strengthening the joint structure and making an electrical contact between the second aluminum plates; and
    an opposing piece for the bolt, for pressing the joint structure together.

2. The joint structure as defined in claim 1, wherein the first coating is made of tin.

3. The joint structure as defined in claim 1, wherein the joint structure further comprises:
    a second coating on a surface of the second aluminum plates to improve the electrical contact.

4. The joint structure as defined in claim 3, wherein the joint structure further comprises:
    a third coating on a surface of the supporting profile to improve the electrical contact.

5. The joint structure as defined in claim 4, wherein the third coating is made of tin.

6. The joint structure as defined in claim 3, wherein the second coating is made of tin.

7. The joint structure as defined in claim 1, wherein the opposing piece is a threaded moulding or a combination of a nut and a base plate.

8. The joint structure as defined in claim 1, wherein the first and second presser rubbers have a wavy cross section at least on one side thereof.

* * * * *